United States Patent
Chang et al.

(10) Patent No.: US 9,405,148 B2
(45) Date of Patent: Aug. 2, 2016

(54) LIGHT SOURCE MODULE, BACKLIGHT ASSEMBLY, AND DISPLAY DEVICE INCLUDING THE SAME

(71) Applicant: Samsung Display Co., Ltd., Yongin, Gyeonggi-Do (KR)

(72) Inventors: Moon Hwan Chang, Yongin-si (KR); Jin Seo, Osan-si (KR); Seok Hyun Nam, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 155 days.

(21) Appl. No.: 14/467,980

(22) Filed: Aug. 25, 2014

(65) Prior Publication Data

US 2015/0268513 A1  Sep. 24, 2015

(30) Foreign Application Priority Data

Mar. 24, 2014  (KR) .................. 10-2014-0034236

(51) Int. Cl.
| | | |
|---|---|---|
| G09F 13/04 | (2006.01) | |
| G02F 1/1335 | (2006.01) | |
| H01L 33/00 | (2010.01) | |
| H01L 25/075 | (2006.01) | |
| H01L 33/58 | (2010.01) | |

(52) U.S. Cl.
CPC .... *G02F 1/133605* (2013.01); *G02F 1/133603* (2013.01); *H01L 25/0753* (2013.01); *H01L 33/00* (2013.01); *G02F 2001/133607* (2013.01); *H01L 33/58* (2013.01)

(58) Field of Classification Search
CPC .................. G02F 1/133603; G02F 1/133605; G02F 2001/133614; G02F 2001/13316; G02F 2001/133601; F21V 13/04; F21V 23/004; F21V 7/04
USPC ............................................ 362/97.1–97.3
See application file for complete search history.

(56) References Cited

U.S. PATENT DOCUMENTS

| | | | |
|---|---|---|---|
| 7,114,838 B2 | 10/2006 | Wu | |
| 7,602,559 B2 | 10/2009 | Jang et al. | |
| 7,787,073 B2 | 8/2010 | Bang | |
| 8,390,017 B2 * | 3/2013 | Liu | H01L 33/58 257/100 |
| 8,508,688 B2 | 8/2013 | Iiyama et al. | |
| 8,558,967 B2 * | 10/2013 | Iiyama | G02F 1/133603 349/62 |
| 8,576,351 B2 * | 11/2013 | Kimura | G02B 19/0028 349/62 |

(Continued)

FOREIGN PATENT DOCUMENTS

| | | |
|---|---|---|
| JP | 2012-216764 A | 11/2012 |
| JP | 2013-037783 A | 2/2013 |

(Continued)

*Primary Examiner* — Ali Alavi
(74) *Attorney, Agent, or Firm* — Knobbe, Martens, Olson & Bear, LLP

(57) ABSTRACT

A light source module, backlight assembly, and display device including the same are disclosed. In one aspect, the light source module includes a printed circuit board, a plurality of light sources arranged over the printed circuit board, and a plurality of optical lenses respectively arranged over the light sources. Each of the optical lenses has upper and lower surfaces opposing each other. The light source module further includes a plurality of reflection patterns respectively formed on the optical lenses. Each of the reflection patterns includes a first reflection pattern formed on the lower surface of the corresponding optical lens and a second reflection pattern formed on the upper surface of the corresponding optical lens.

20 Claims, 12 Drawing Sheets

(56) References Cited

U.S. PATENT DOCUMENTS

| | | | |
|---|---|---|---|
| 8,926,114 B2 * | 1/2015 | Park | G02B 19/0071 362/97.1 |
| 9,182,101 B2 * | 11/2015 | Nakamura | F21V 13/12 |
| 2006/0126343 A1 * | 6/2006 | Hsieh | F21K 9/00 362/327 |
| 2007/0195534 A1 | 8/2007 | Ha et al. | |
| 2011/0089453 A1 | 4/2011 | Min | |
| 2012/0235553 A1 | 9/2012 | Bhairi | |
| 2013/0155690 A1 | 6/2013 | Chen et al. | |

FOREIGN PATENT DOCUMENTS

| | | |
|---|---|---|
| KR | 10-0803341 B1 | 2/2008 |
| KR | 10-2012-0000756 A | 1/2012 |
| KR | 10-2012-0058928 A | 6/2012 |

* cited by examiner

LIGHT SOURCE MODULE, BACKLIGHT ASSEMBLY, AND DISPLAY DEVICE INCLUDING THE SAME

INCORPORATION BY REFERENCE TO ANY PRIORITY APPLICATIONS

This application is based on and claims priority from Korean Patent Application No. 10-2014-0034236, filed on Mar. 24, 2014 in the Korean Intellectual Property Office, the disclosure of which is incorporated herein in its entirety by reference.

BACKGROUND

1. Field

The described technology generally relates to a light source module, a backlight assembly, and a display device including the same.

2. Description of the Related Technology

Liquid crystal displays (LCDs) are display devices in which liquid crystals are interposed between two substrates. The molecular orientation of the liquid crystals in each pixel is modified via the application of a voltage between electrodes formed on each of the substrates in order to display images. Unlike cathode ray tube (CRT) and plasma display panel (PDP) displays, LCDs are not self-luminous, and thus, cannot be used without a separate light source. Accordingly, a backlight assembly for substantially uniformly emitting light is required to enable LCDs to be used even in dark environments.

Backlight assemblies include a light source module, a diffusion plate, and optical sheets. The light source module can include light-emitting diode (LED) light sources which have superior efficiency when compared to other light sources. In a direct-illumination type backlight assembly, optical lenses are arranged over the LED light sources to improve the diffusion of light emitted from the LED light sources.

SUMMARY OF CERTAIN INVENTIVE ASPECTS

One inventive aspect is a light source module with improved luminance uniformity.

Another aspect is a backlight assembly with an improved light quality.

Another aspect is a display device with an improved display quality.

Another aspect is a light source module comprising: a printed circuit board; a plurality of light sources arranged on the printed circuit board; a plurality of optical lenses arranged on upper portions of the respective light sources; and a plurality of reflection patterns including a first reflection pattern arranged on lower portions of the respective optical lenses and a second reflection pattern arranged on upper portions of the respective optical lenses.

Each of the first reflection pattern and the second reflection pattern may comprise a lens abrasion prevention layer, a reflection layer formed on the lens abrasion prevention layer, and a protection layer formed on the reflection layer.

The reflection layer may comprise aluminum or silver.

The reflection layer may comprise a plurality of layers having different refractive indexes.

Each of the plurality of layers may be formed of any material selected from the group including magnesium fluoride, silicon dioxide, tantalum pentoxide, zinc sulfide, and titanium dioxide.

The second reflection pattern may be formed in a belt shape having a predetermined width measured from a circumference to a center point of an upper surface portion of the optical lens.

The second reflection pattern may be formed in a belt shape having a predetermined width measured from a center point to a circumference of an upper surface portion of the optical lens.

The second reflection pattern may be formed in a belt shape having a predetermined width measured between a circumference and a center point of an upper surface portion of the optical lens.

The second reflection pattern may be formed in a belt shape having a non-uniform width measured from a circumference to a center point of an upper surface portion of the optical lens.

A width of the second reflection pattern based on a center point of an upper surface portion of the optical lens may be about 20% to about 40% of a diameter of the optical lens.

The second reflection pattern may cover a whole upper surface portion of the optical lens.

The optical lens may comprise an upper surface portion, a bottom surface portion, and a side surface portion, and an upper groove having a concavely recessed shape in a downward direction is formed in a center portion of an upper side of the optical lens.

The optical lens may comprise an upper surface portion, a bottom surface portion, and a side surface portion, and an upper surface portion of the optical lens includes an upwardly convex surface.

Another aspect is a backlight assembly comprising: a receptacle; a printed circuit board arranged on the receptacle; a plurality of light sources arranged on the printed circuit board; a plurality of optical lens arranged on upper portions of the respective light sources; a reflection pattern including a first reflection pattern arranged on lower portions of the respective optical lenses and a second reflection pattern arranged on upper portions of the respective optical lenses; and a reflection sheet arranged on an upper portion of the receptacle and including an opening in which the optical lens is inserted.

Each of the first reflection pattern and the second reflection pattern may comprise a lens abrasion prevention layer, a reflection layer formed on the lens abrasion prevention layer, and a protection layer formed on the reflection layer.

A width of the second reflection pattern based on a center point of an upper surface portion of the optical lens may be about 20% to about 40% of a diameter of the optical lens.

The second reflection pattern may cover a whole upper surface portion of the optical lens.

Another aspect is a display device comprising: a receptacle; a printed circuit board arranged on the receptacle; a plurality of light sources arranged on the printed circuit board; a plurality of optical lens arranged on upper portions of the respective light sources; a reflection pattern including a first reflection pattern arranged on lower portions of the respective optical lenses and a second reflection pattern arranged on upper portions of the respective optical lenses; a reflection sheet arranged on an upper portion of the receptacle and including an opening in which the optical lens is inserted; an optical sheet arranged on an upper portion of the reflection sheet; and a display panel arranged on an upper portion of the optical sheet.

A width of the second reflection pattern based on a center point of an upper surface portion of the optical lens may be about 20% to about 40% of a diameter of the optical lens.

The second reflection pattern may cover a whole upper surface portion of the optical lens.

Another aspect is a light source module, comprising a printed circuit board; a plurality of light sources arranged over the printed circuit board; a plurality of optical lenses respectively arranged over the light sources, wherein each of the optical lenses has upper and lower surfaces opposing each other; and a plurality of reflection patterns respectively formed on the optical lenses, wherein each of the reflection patterns includes a first reflection pattern formed on the lower surface of the corresponding optical lens and a second reflection pattern formed on the upper surface of the corresponding optical lens.

Each of the first and second reflection patterns can further comprise a lens abrasion prevention layer, a reflection layer formed on the lens abrasion prevention layer, and a protection layer formed on the reflection layer. Each of the reflection layers can be formed at least partially of aluminum or silver. Each of the reflection layers can further comprise a plurality of layers having different refractive indexes. Each of the plurality of layers can be formed of a material selected from the group including magnesium fluoride, silicon dioxide, tantalum pentoxide, zinc sulfide, and titanium dioxide. Each of the second reflection patterns can have a ring shape having a predetermined width. Each of the second reflection patterns can be formed along the perimeter of the corresponding optical lens. Each of the second reflection patterns can be formed between the perimeter and the center of the corresponding optical lens.

Each of the second reflection patterns can have a ring shape having a non-uniform width. Each of the second reflection patterns can have a substantially circular shape that is substantially concentric with the corresponding optical lens. Each of the second reflection patterns can have a width that is about 20% to about 40% of the diameter of the corresponding optical lens. Each of the second reflection patterns can cover the entire upper surface of the corresponding optical lens. Each of the optical lenses can further have an upper groove having a concavely recessed shape defined in the center of the upper surface thereof. Each of the optical lenses can further have an upwardly convex surface defined in the center of the upper surface thereof.

Another aspect is a backlight assembly, comprising a receptacle; a printed circuit board arranged over the receptacle; a plurality of light sources arranged over the printed circuit board; a plurality of optical lens respectively arranged over the light sources, wherein each of the optical lenses has upper and lower surfaces opposing each other; a plurality of reflection patterns respectively formed on the optical lenses, wherein each of the reflection patterns includes a first reflection pattern formed on the lower surface of the corresponding optical lens and a second reflection pattern formed on the upper surface of the corresponding optical lens; and a reflection sheet arranged over the receptacle and including a plurality of openings in which the optical lens are placed.

Each of the first and second reflection patterns can comprise a lens abrasion prevention layer, a reflection layer formed on the lens abrasion prevention layer, and a protection layer formed on the reflection layer. The width of each of the second reflection patterns can be about 20% to about 40% of the diameter of the corresponding optical lens. Each of the second reflection patterns can cover the entire upper surface of the corresponding optical lens.

Another aspect is a display device, comprising a receptacle; a printed circuit board arranged over the receptacle; a plurality of light sources arranged over the printed circuit board; a plurality of optical lens respectively arranged over the light sources, wherein each of the optical lenses has upper and lower surfaces opposing each other; a plurality of reflection patterns respectively formed on the optical lenses, wherein each of the reflection patterns includes a first reflection pattern formed on the lower surface of the corresponding optical lens and a second reflection pattern formed on the upper surface of the corresponding optical lens; a reflection sheet arranged over the receptacle and including a plurality of openings in which the optical lens are placed; an optical sheet arranged over the reflection sheet; and a display panel arranged over the optical sheet.

Each of the second reflection patterns can at least partially overlap the corresponding first reflection pattern.

According to at least one embodiment of the described technology, at least the following effects can be achieved.

The reflection of the light that is emitted from the light sources can be controlled by the first reflection pattern and the second reflection pattern formed on the optical lens. Accordingly, the number and intensity of hot spots generated by the light source module can be reduced, and as a result, the luminance uniformity of the light source module can be improved.

Further, the light quality of the backlight assembly that includes the light source module can be improved and the display quality of the display device can be improved.

The effects of the described technology are not limited to the contents as exemplified above, but further various effects are included in the description.

DETAILED DESCRIPTION OF CERTAIN INVENTIVE EMBODIMENTS

When a light-emitting diode (LED) light source is included in a backlight assembly, a large quantity of light is directly emitted from the LED light source in an upward direction. This can cause the formation of a hot spot in which a center region of an optical lens formed over the LED light source is brighter than the other surrounding regions. Such hot spots can be generated when light that is emitted from a side portion or a lower portion of the LED light source is reflected by the optical lens, the reflected light is incident to the inside of the optical lens, and then the incident light travels in an upward direction.

Due to the generation of hot spots as described above, the luminance of light emitted from the light source module may become non-uniform. Thus, the light quality of the backlight assembly that includes the light source module and the display quality of the display device may be reduced.

Advantages and features of the described technology and methods of accomplishing the same may be understood more readily by reference to the following detailed description of embodiments and the accompanying drawings. The described technology may, however, be embodied in many different forms and should not be construed as being limited to the embodiments set forth herein. Rather, these embodiments are provided so that this disclosure will be thorough and complete and will fully convey the concept of the described technology to those skilled in the art, and the described technology will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Hereinafter, embodiments of the described technology will be described in detail with reference to the accompanying drawings.

Figure 1:
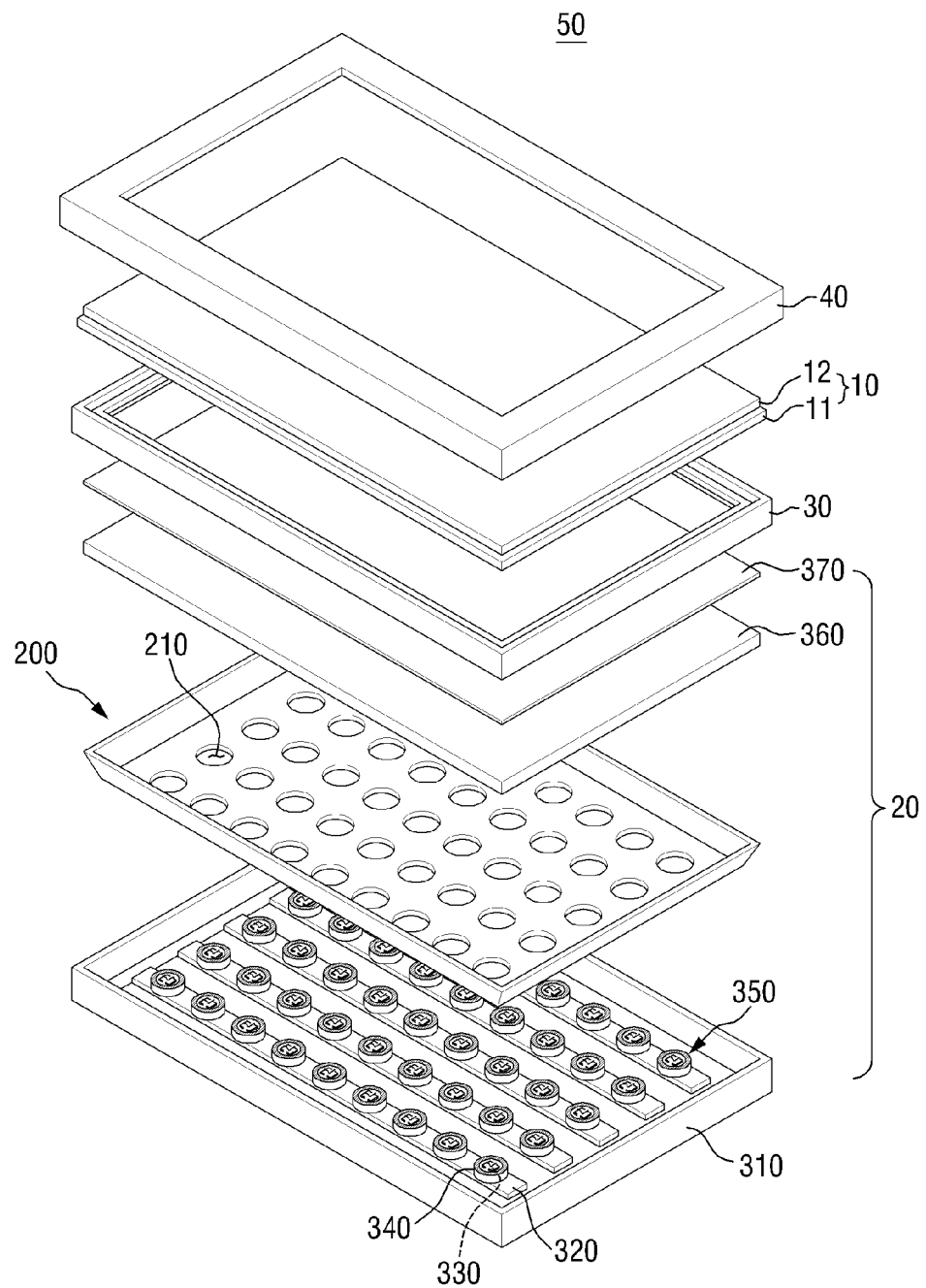
FIG. 1 is an exploded perspective view of a display device according to an embodiment.

FIG. 1 is an exploded perspective view of a display device according to an embodiment.

Referring to FIG. 1, the display device 50 includes a display panel 10 and a backlight assembly 20 arranged on a lower portion of the display panel 10.

The display panel 10 includes an upper display plate 12 and a lower display plate 11, which face each other. The upper and lower display plates 12 and 11 can be combined with each other by a sealing material (not illustrated). A liquid crystal layer (not illustrated) can be interposed between the upper and lower display plates 12 and 11. A polarizing sheet (not illustrated) can be attached to the outside of each of the upper and lower display plates 12 and 11.

A plurality of pixel electrodes, wirings for driving the pixel electrodes, and switching devices can be formed on the lower display plate 11. Further, a common electrode can be provided on one of the upper and lower display plates 12 and 11 to apply an electric field to the liquid crystal layer. A color filter and/or a black matrix can also be formed on one of the upper and lower display plates 12 and 11.

The backlight assembly 20 includes a lower receptacle 310, a light source module, a reflection sheet 200, an optical plate 360, and an optical sheet 370.

The lower receptacle 310 accommodates the light source module, the reflection sheet 200, the optical plate 360, and the optical sheet 370 therein. The lower receptacle 310 may be a bottom chassis. The lower receptacle 310 may include a recess portion (not illustrated) in which the light source module is arranged.

The light source module provides light to the display panel 10. The light source module includes a printed circuit board 320, a plurality of light sources 330, a plurality of optical lenses 340, and a plurality of reflection patterns 350.

The printed circuit board 320 provides a space in which a plurality of light sources 330 are mounted and includes a wiring layer (not illustrated) forming electrical paths through which power for driving the light sources 330 is supplied thereto. A plurality of printed circuit boards 320, each having a substantially bar shape, may be provided. The respective printed circuit boards 320 may be arranged substantially parallel to each other. The respective printed circuit boards 320 may be arranged in the recess portion of the lower receptacle 310.

The light sources 330 are mounted on the printed circuit board 320 and may be point light sources. An example of a point light source may be an LED light source. The majority of the light emitted from the respective light sources 330 can be emitted in an upward direction, and may be partially emitted in a horizontal or downward direction. Gap distances between adjacent light sources 330 mounted on the printed circuit board 320 may be substantially equal to each other or may be different from each other. Further, if a plurality of printed circuit boards 320 are provided, the numbers of light sources 330 mounted on the respective printed circuit boards 320 may be substantially equal to each other or may be different from each other. The details of the light source 330 will be described later.

The optical lenses 340 are respectively arranged over the light sources 330. The optical lens 340 diffuses light emitted from the light source 330. The details of the optical lens 340 will be described later.

The reflection patterns 350 are formed on the respective optical lenses 340. The reflection pattern 350 reflect the light emitted through the optical lens 340. The details of the reflection pattern 350 will be described later.

The reflection sheet 200 may serve to reflect the light that is incident upon the lower side of the light source 330 back in an upward direction. The reflection sheet 200 formed as a continuous sheet. The reflection sheet 200 may include openings 210 corresponding to the light sources 330. The diameter or the size of each of the openings 210 may be greater than the outer diameter or the size of the optical lens 340. However, in some embodiments, the diameter or the size of each of the openings 210 may be substantially equal to or less than the outer diameter or the size of the optical lens 340.

The optical plate 360 and/or the optical sheet 370 may be arranged over an upper portion of the light source module as optical modulation structures that modulate light. In an exemplary embodiment, the optical plate 360 is a diffusion plate. The optical sheet 370 may be a prism sheet, a diffusion sheet, a micro lens sheet, a lenticular sheet, a phase difference compensation sheet, a reflective polarizing sheet, or a combination thereof. A plurality of optical sheets 370 may be used or one complex optical sheet, in which a plurality of optical modulation characteristics as exemplified above are implemented, may be used. Since various combination examples of optical modulation structures are known in the art, a detailed explanation thereof will be omitted.

The display panel 10 is placed in a middle receptacle 30. The middle receptacle 30 may be a mold frame or a middle mold. The middle receptacle 30 may be fixedly fastened to the lower receptacle 310. The optical plate 360 and/or the optical sheet 370 placed in the lower receptacle 310 or the middle receptacle 30. In FIG. 1, the middle receptacle 30 is illustrated as having a substantially rectangular frame shape. However, two bar-type middle receptacles may be provided along the long side or the short side of the display device.

An upper receptacle 40 is arranged on the upper portion of the display panel 10. The upper receptacle 40 may be a top chassis or a bezel. The upper receptacle 40 includes an opening or a window and covers the border of the display panel 20 to protect the same. The upper receptacle 40 may be combined with the lower receptacle 310.

Hereinafter, the above-described optical source 330, optical lens 340, and reflection pattern 350 will be described in greater detail.

Figure 2:
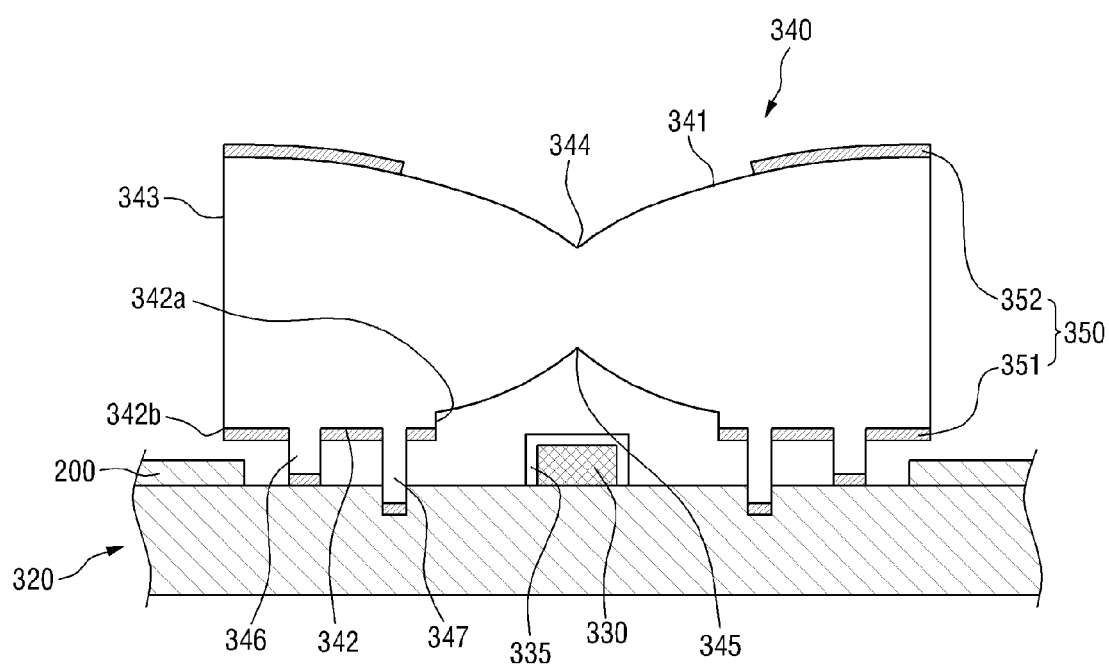
FIG. 2 is a partial cross-sectional view of a region in which a light source module is arranged in a display device according to an embodiment.
Figure 3:
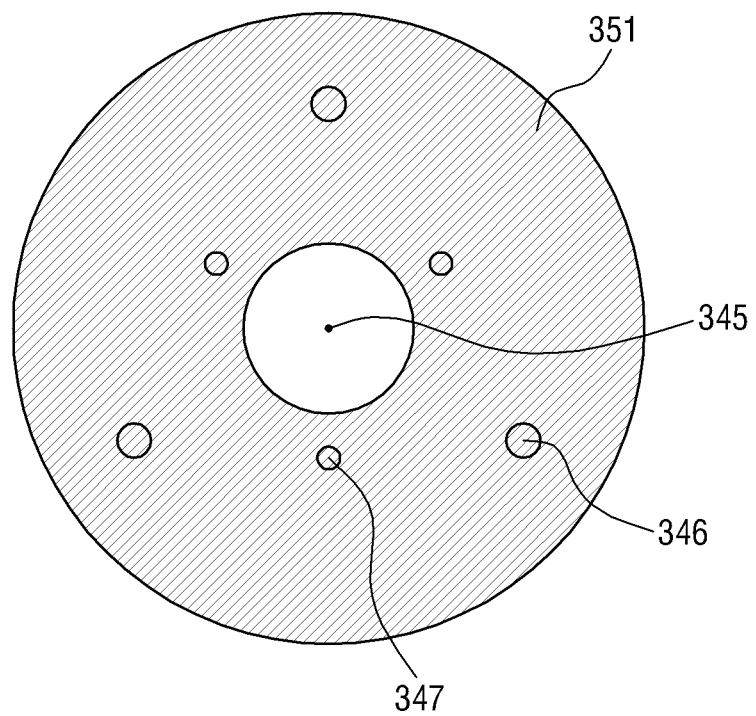
FIG. 3 is a bottom view of the optical lens of FIG. 2.
Figure 4:
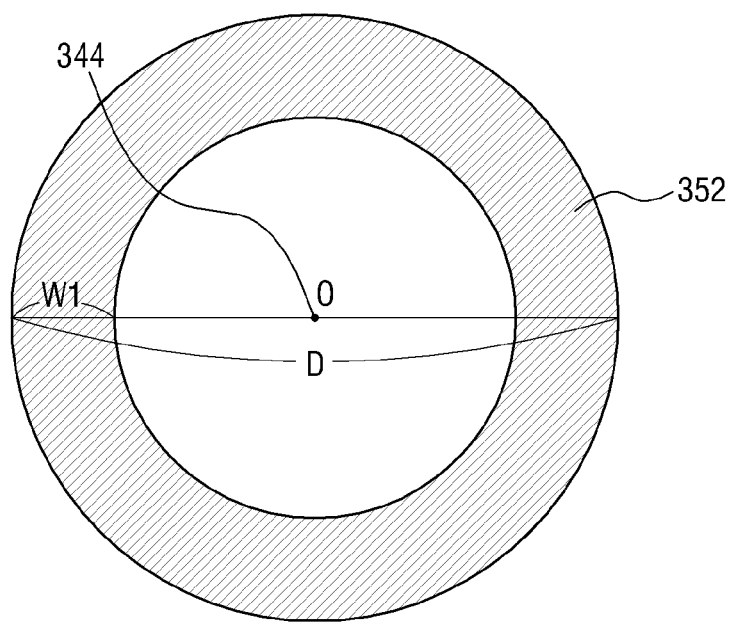
FIG. 4 is a plan view of the optical lens of FIG. 2.
Figure 5:
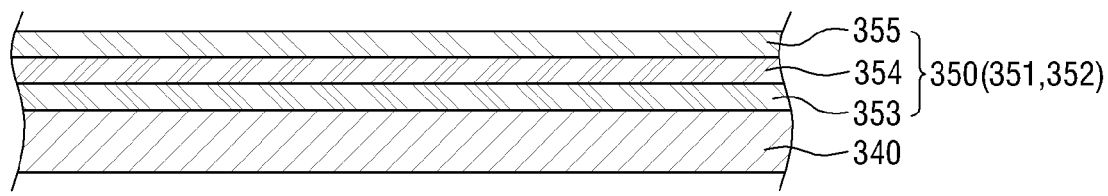
FIG. 5 is a cross-sectional view illustrating the cross-sectional structure of the reflection pattern of FIG. 2.
Figure 6:
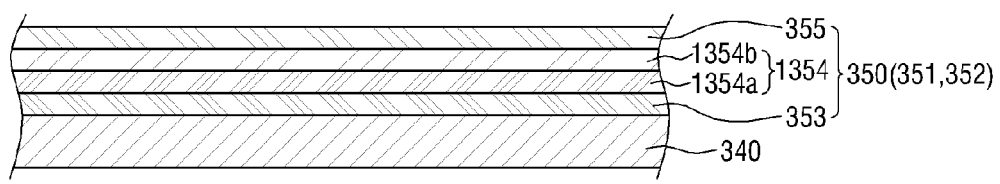
FIG. 6 is a cross-sectional view illustrating another cross-sectional structure of the reflection pattern of FIG. 2.

FIG. 2 is a partial cross-sectional view of a region in which a light source module is arranged in a display device according to an embodiment. FIG. 3 is a bottom view of the optical lens of FIG. 2. FIG. 4 is a plan view of the optical lens of FIG. 2. FIG. 5 is a cross-sectional view illustrating the cross-section structure of a reflection pattern of FIG. 2. FIG. 6 is a cross-sectional view illustrating another cross-sectional structure of a reflection pattern of FIG. 2.

Referring to FIG. 2, the light source 330 may be mounted on an electrode portion of the printed circuit board 320 by surface mount technology (SMT). The electrode portion of the printed circuit board 320, on which the light source 330 is mounted, may be defined through the exposure of a wiring layer.

The light source 330 may include, for example, a blue light emitting element, a red light emitting element, and a green light emitting element such that the combination of emitted light is white. As another example, the light source 330 may include a blue light emitting element, and may be provided with fluorescent materials having red and green light emission peaks when blue light is applied thereto, or a fluorescent layer 335 including a fluorescent material having a yellow light emission peak such that the combination of emitted light is white. As still another example, the light source 330 may include a UV light emitting element and may be provided with a fluorescent layer 335 including fluorescent materials having red, green, and blue light emission peaks when UV light is incident thereon such that the combination of emitted light is white. The fluorescent layer 335 may be arranged to cover not only the upper surface of the light source 330 but also the side surface thereof.

The optical lens 340 may include an upper surface portion or upper surface 341, a bottom surface portion or lower surface 342, and a side surface portion or side surface 343. The optical lens 340 may be formed of polycarbonate or glass.

The upper surface portion 341 of the optical lens 340 may include a flat surface or a convex surface. In the embodiment of FIG. 2, the center of the upper side of the optical lens 340 includes an upper groove 344 having a lower concave recess shape. In this embodiment, the center of the lower side of the optical lens 340 includes a lower groove 345 having an upper concave recess shape. The upper groove 344 and the lower groove 345 increase the diffusion of light emitted from the light source 330 in the direction of the side surface 343. Since the optical lens 340 does not increase the luminance in the upper direction of the light source 330, it may be applied to a display device having a relatively thin profile that does not require high luminance since the loss of light measured from the light source module to the display panel is low for these display devices.

Referring to the embodiment of FIG. 2, the bottom surface portion 342 of the optical lens 340 is positioned in the vicinity of the lower groove 345. The bottom surface portion 342 of the optical lens 340 is substantially flat. The upper groove 344 and the lower groove 345 are formed in the center portion of the optical lens 340 and are arranged to overlap each other. Further, the light source 330 is positioned in the center portion of the optical lens 340 and overlaps the upper and lower grooves 344 and 345.

The bottom surface portion 342 of the optical lens 340 may be substantially flat. The bottom surface portion 342 of the optical lens 340 may be substantially parallel to the surface of the printed circuit board 320, but is not limited thereto. Referring again to the embodiment of FIG. 2, the bottom surface portion 342 of the optical lens 340 is defined by the area between an inner corner 342a that is adjacent to the lower groove 345 and an outer corner 342b that is adjacent to the side surface portion. In a plan view, the inner corner 342a and the outer corner 342b of the bottom surface portion 342 may form two concentric circles.

A lens support leg 346 is formed on the bottom surface portion 342 of the optical lens 340. The lens support leg 346 may be formed separately from the bottom surface portion 342 of the optical lens 340 to be attached to the bottom surface portion 342 of the optical lens 340 or may be integrally formed with the bottom surface portion 342 of the optical lens 340.

The lens support leg 346 may be formed to have a column shape. In the embodiment of FIGS. 2 and 3, the optical lens 340 has three lens support legs 346. However, the number of lens support legs 346 may be greater than four, or less than three in other embodiments. The bottom surface of the lens support leg 346 may be attached to the surface of the printed circuit board 320. For example, the bottom surface of the lens support leg 346 may be attached to the surface of the lower receptacle 310 through an adhesive layer (not illustrated). The optical lens 340 may be spaced apart from the light source 330 by a predetermined distance based on the length of the lens support leg 346.

With further reference to the embodiment of FIG. 2, an alignment projection portion 347 is formed on the bottom surface portion 342 of the optical lens 340. The alignment projection portion 347 is arranged closer to the center of the optical lens 340 than the lens support leg 346 and may be integrally formed with the bottom surface portion 342 of the optical lens 340. The alignment projection portion 347 may be fitted on the printed circuit board 320 to ensure that the optical lens 340 is seated in the correct position. The alignment projection portion 347 may have a column shape. In the embodiment of FIGS. 2 and 3, the optical lens 340 includes three lens support legs 346. However, the number of lens support legs 346 may be greater than four, or less than three.

The light source 330 and the optical lens 340 may be engaged with the printed circuit board 320 to be modularized. The light source 330 and the optical lens 340 are inserted into the opening 210 in the reflection sheet 200.

In some embodiments, the reflection pattern 350 is formed on the optical lens 340 and includes a first reflection pattern 351 and second reflection pattern 352.

The first reflection pattern 351 is formed on the bottom surface portion 342 of the optical lens 340. Referring to FIGS. 2 and 3, the first reflection pattern 351 is formed even on the lens support leg 346 and the alignment projection portion 347 but is not formed on the lower groove 345. The first reflection pattern 351 reflects light which is emitted from the light source 330, is then reflected from the upper surface portion 341 of the optical lens 340, and then travels downward in the direction of the side surface portion 343 of the optical lens 340.

The second reflection pattern 352 is formed on the upper surface portion 341 of the optical lens 340. Referring to FIGS. 2 and 4, the second reflection pattern 352 is formed to have a ring shape having a predetermined width W1 measured in the direction from the circumference of the upper surface portion 341 of the optical lens 340 to a center point O.

The second reflection pattern 352 reflects light which is emitted from the light source 330 and travels to the circumference of the upper surface portion 341 of the optical lens 340, so as to diffuse the light in the direction of the side surface portion 343 of the optical lens 340.

Further, when the light is emitted from the light source 330 is reflected from the upper surface portion 341 of the optical lens 340 and travels to the side surface portion 343 of the optical lens 340, is reflected from the side surface portion 343, of the optical lens 340, then travels to the first reflection pattern 350, is reflected again from the first reflection pattern 351, and travels to the circumferential portion of the upper surface portion 341 of the optical lens 340, the second reflection pattern 352 reflects the light and diffuse the light in the direction of the side surface portion 343 of the optical lens 340.

Further, the second reflection pattern 352 may intercept the light that travels to the circumferential portion of the upper surface portion 341 of the optical lens 340.

The light source module having the above-described configuration may reduce the occurrence of hot spots through increasing the diffusion of the light emitted from the light source 330 via the light reflection of the first and second reflection patterns 351 and 352 in the direction of the side portion 343 of the optical lens 340. Further, the light source module may be applied when the respective gap distances between the adjacent light sources 330 are relatively small so that the generation of hot spots can be reduced. This is because although the light does not travel to the circumferential region of the upper surface portion 341 of the optical lens 340 by the light interception function of the second reflection pattern 352, the light emitted from the light sources 330 that are adjacent to the region between the adjacent light sources 330 overlap each other as the respective gap distances between the adjacent light sources 330 decreases, and the quantity of light in the region increases. Thus, the difference between the brightness of light in the center region of the upper portion of the optical lens 340 and the brightness of light in the circumferential region of the upper portion of the optical lens around one light source 330 is not great.

In some embodiments, the width W1 of the second reflection pattern 352 around the center point O of the upper surface portion 341 of the optical lens 340 is about 20% to about 40% of the diameter D of the optical lens 340. In these embodiments, the orientation angle of the light may be increased to about 140° to about 180°. The orientation angle of the light is defined as a viewing angle of the display device including the light source module. However, depending on the embodiment, the width W1 of the second reflection pattern 352 may be less than about 20% or greater than about 40% of the diameter of the optical lens 340.

Referring to the embodiment of FIG. 5, the reflection patterns 350 (351 and 352) include a lens abrasion prevention layer 353, a reflection layer 354, and a protection layer 355.

The lens abrasion prevention layer 353 is a layer that is formed on the optical lens 340 and may be formed through an aluminum anodizing process. The lens abrasion prevention layer 353 can prevent deterioration in the function of the optical lens 340 due to the abrasion of the optical lens 340.

The reflection layer 354 may be formed on the lens abrasion prevention layer 353 by coating aluminum or silver thereon. The reflection layer 354 enables the reflection patterns 350 (351 and 352) to reflect light.

The protection layer 355 may be formed on the reflection layer 354 by coating oxide thereon. The protection layer 355 protects the reflection pattern 350 (351 and 352) from the environment external to the optical lens 340.

Referring to the embodiment of FIG. 6, the reflection pattern 350 (351 and 352) have another cross-sectional structure. That is, the reflection pattern 350 (351 and 352) of this embodiment includes the lens abrasion prevention layer 353, a reflection layer 1354, and the protection layer 355.

The reflection layer 1354 includes a plurality of layers 1354a and 1354b having different refractive indexes in comparison to the reflection layer 354. The layers 1354a and 1354b form various reflection points of the reflection pattern 350 (351 and 352). Each of the layers 1354a and 1354b may be formed of any material selected from the group including magnesium fluoride, silicon dioxide, tantalum pentoxide, zinc sulfide, and titanium dioxide. The layers 1354a and 1354b may be formed using physical vapor deposition (PVD), chemical vapor deposition (CVD), ion beam deposition, molecular beam epitaxy, or sputtering deposition. The thicknesses of the layers 1354a and 1354b may be about 10 nm to about 250 nm, or may be several μm. However, the described technology is not limited thereto and the thicknesses of the layers 1354a and 1354b may be less than about 10 nm or greater than about 250 nm. In FIG. 6, the layers 1354a and 1354b are illustrated as two layers, but may include three or more layers.

As described above, the light source module increases the diffusion of light emitted from the light source in the direction of the side portion 343 of the optical lens 340 through the light reflection of the first and second reflection patterns 341 and 342. Accordingly, the uniformity of the luminance of light emitted from the light source module can be improved, preventing the generation of hot spots.

The reflection patterns having various shapes can minimize the luminance non-uniformity through controlling the diffusion of light emitted from the light source. Detailed examples will be described below through various embodiments.

Figure 7:
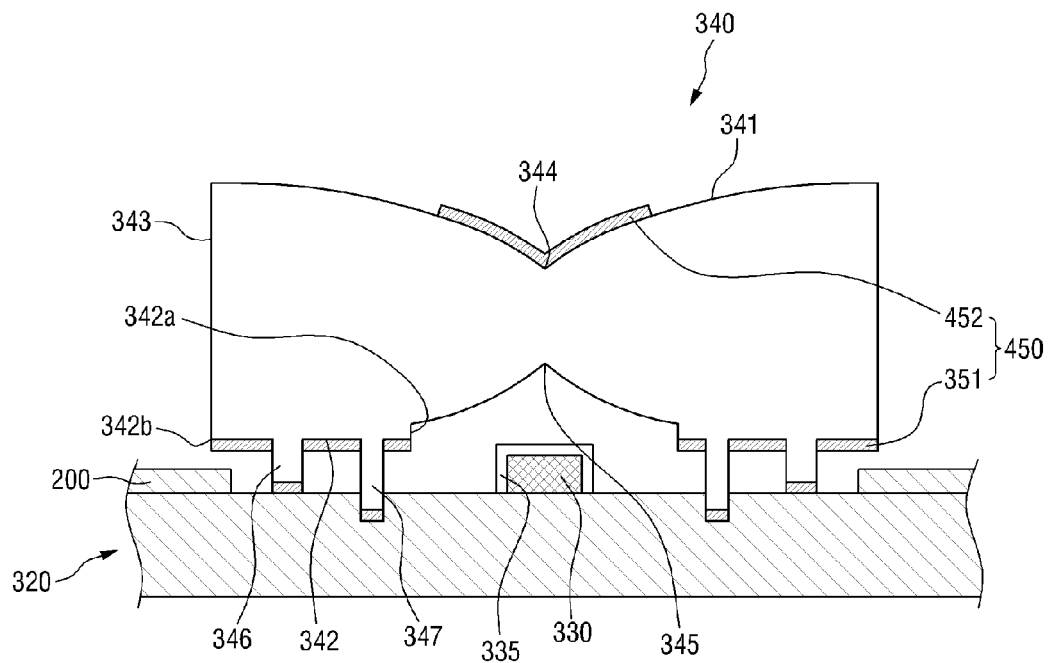
FIG. 7 is a partial cross-sectional view of a region in which a light source module is arranged in a display device according to another embodiment.
Figure 8:
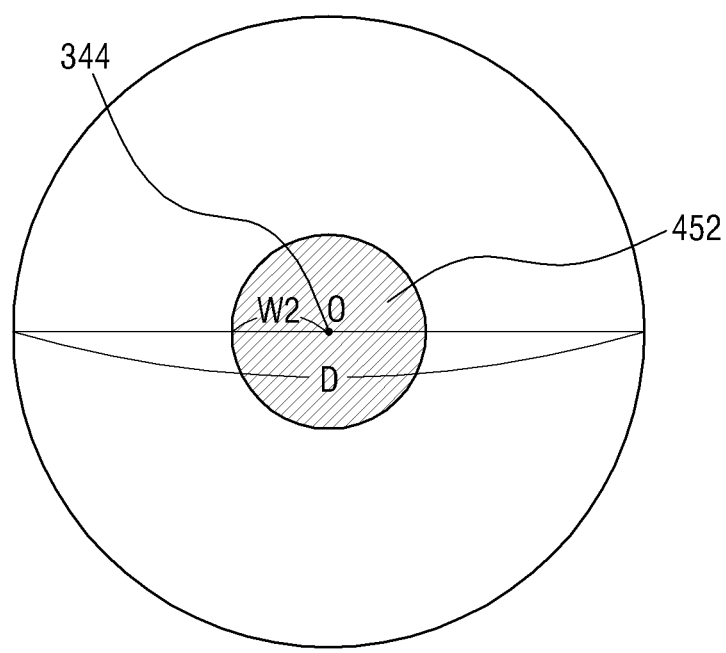
FIG. 8 is a plan view of the optical lens of FIG. 7.

FIG. 7 is a partial cross-sectional view of a region in which a light source module is arranged in a display device according to another embodiment. FIG. 8 is a plan view of the optical lens of FIG. 7.

Referring to the embodiment of FIGS. 7 and 8, the reflection pattern 450 includes a first reflection pattern 351 and a second reflection pattern 452 and the second reflection pattern 452 is arranged in the center portion 344 of an optical lens 340.

That is, the second reflection pattern 452 of the reflection pattern 450 is formed to have a shape that has a predetermined width W2 in a direction measured from the center point O of the upper surface portion 341 of the optical lens 340 to the circumference thereof. As shown in FIG. 8, the width W2 as described is the radius of the second reflection pattern 452.

The second reflection pattern 452 reflects light which is emitted from the light source 330 and travels to the center of the upper surface portion 341 of the optical lens 340 so as to diffuse the light in the direction of the side surface portion 343 of the optical lens 340.

Further, when the light is emitted from the light source 330, is reflected from the upper surface portion 341 of the optical lens 340, and travels to the side surface portion 343 of the optical lens 340, is then reflected from the side surface portion 343 of the optical lens 340, travels to the first reflection pattern 351, is reflected again from the first reflection pattern 351, and travels to the center portion of the upper surface portion 341 of the optical lens 340, the second reflection pattern 452 reflects the light and diffuses the light in the direction of the side surface portion 343 of the optical lens 340.

Further, the second reflection pattern 452 intercepts the light that travels to the center portion of the upper surface portion 341 of the optical lens 340.

The light source module having the above-described configuration may reduce the occurrence of hot spots by increasing the diffusion of light emitted from the light source 330 through the reflection of light from the first reflection pattern 351 and the second reflection pattern 452 in the direction of the side portion 343 of the optical lens 340. Further, since the light source module can intercept the light emitted to the center region of the upper surface portion 341 of the optical lens 340 through the light interception function of the second reflection pattern 452, it may be applied when the respective gap distances between the adjacent light sources 330 are relatively large so that the generation of hot spots can be reduced. This is because the overlapping of light emitted from the light sources 330 that are adjacent to the region between the adjacent light sources 330 decreases, and thus the quantity of light in the region decreases. In order to reduce the difference between the brightness of light in the center region of the upper portion of the optical lens 340 and the brightness of light in the circumferential region of the optical lens 340 around one light source 330, the light emitted to the center region of the upper surface portion 341 of the optical lens 340 should be reduced.

In some embodiments, the width W2 of the second reflection pattern 452 around the center point O of the optical lens 340 may also be about 20% to about 40% of the diameter D of the optical lens 340. In these embodiments, the orientation angle of the light may be increased to about 140° to about 180°. However, depending on the embodiment, the width W2 of the second reflection pattern 452 may be less than about 20% or greater than about 40% of the diameter D of the optical lens 340.

Figure 9:
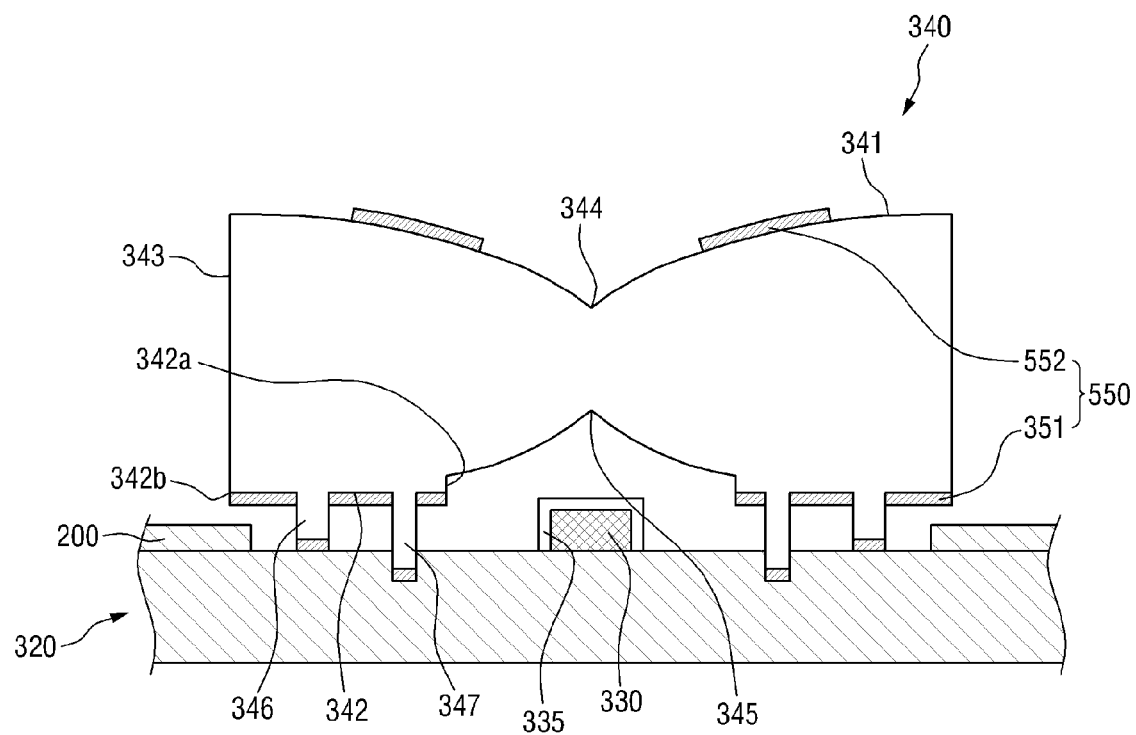
FIG. 9 is a partial cross-sectional view of a region in which a light source module is arranged in a display device according to still another embodiment.
Figure 10:
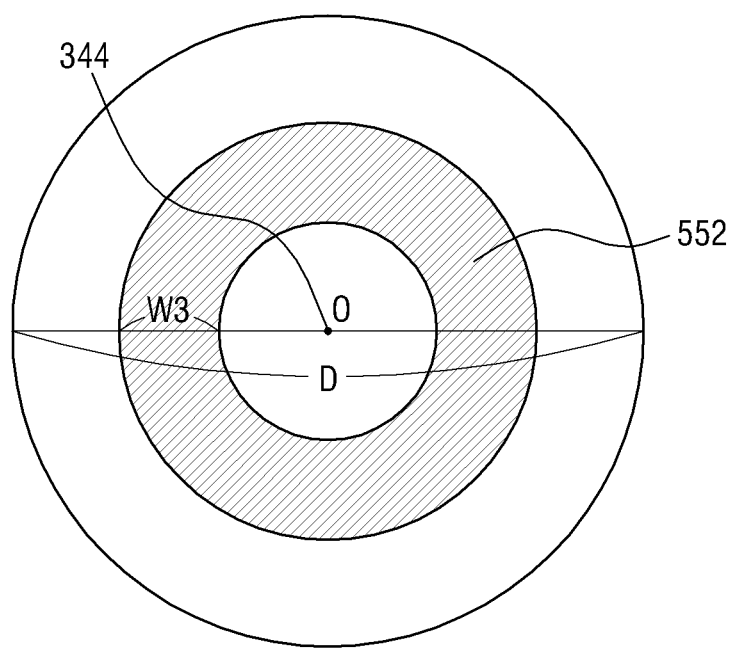
FIG. 10 is a plan view of the optical lens of FIG. 9.

FIG. 9 is a partial cross-sectional view of a region in which a light source module is arranged in a display device according to still another embodiment. FIG. 10 is a plan view of the optical lens of FIG. 9.

Referring to FIGS. 9 and 10, the reflection pattern 550 includes a first reflection pattern 351 and a second reflection pattern 552 and the second reflection pattern 552 is arranged between the circumference and the center portion O of the optical lens 340.

That is, the second reflection pattern 552 of the reflection pattern 550 has a ring shape that with a predetermined width W3 measured in a direction from the circumference to the center point O of the upper surface portion 341 of the optical lens 340. The second reflection pattern 552 may be applied to light sources 330 that are arranged to have a gap distance between the gap distance between the light sources 330 to which the reflection pattern 350 of FIG. 2 is applied and the gap distance between the light sources 330 to which the reflection pattern 450 of FIG. 7 is applied.

The width W3 of the second reflection pattern 552 around the center point O of the optical lens 340 may also be about 20% to about 40% of the diameter D of the optical lens 340. In these embodiments, the orientation angle of the light may be increased to about 140° to about 180°. However, in other embodiments, the width W3 of the second reflection pattern 552 may be less than about 20% or greater than about 40% of the diameter D of the optical lens 340.

Figure 11:
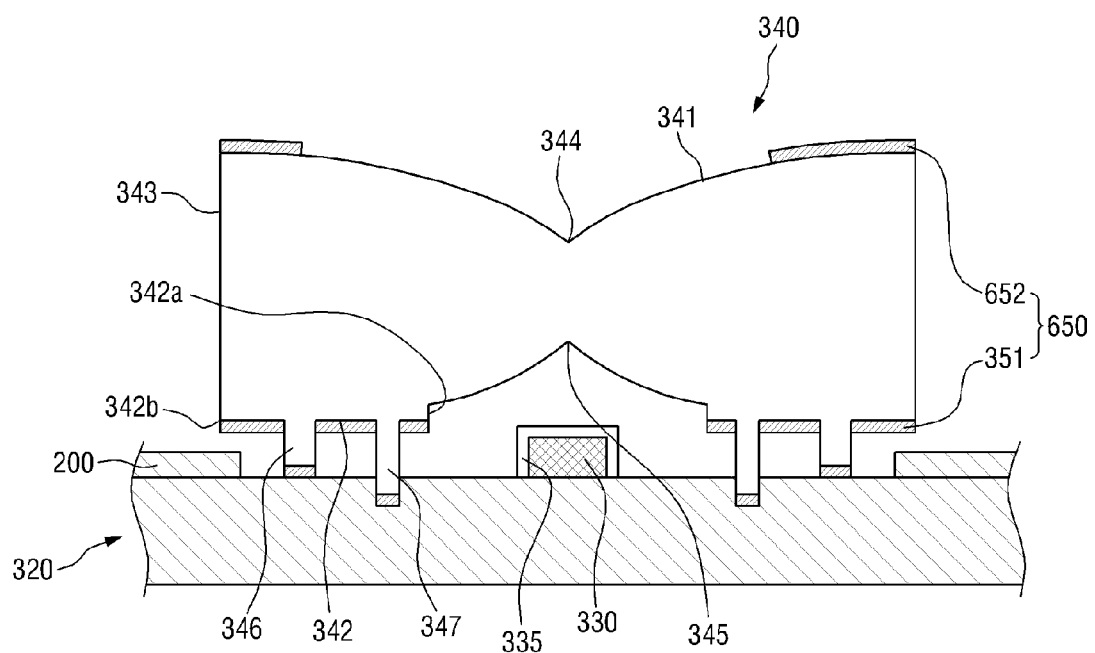
FIG. 11 is a partial cross-sectional view of a region in which a light source module is arranged in a display device according to still another embodiment.
Figure 12:
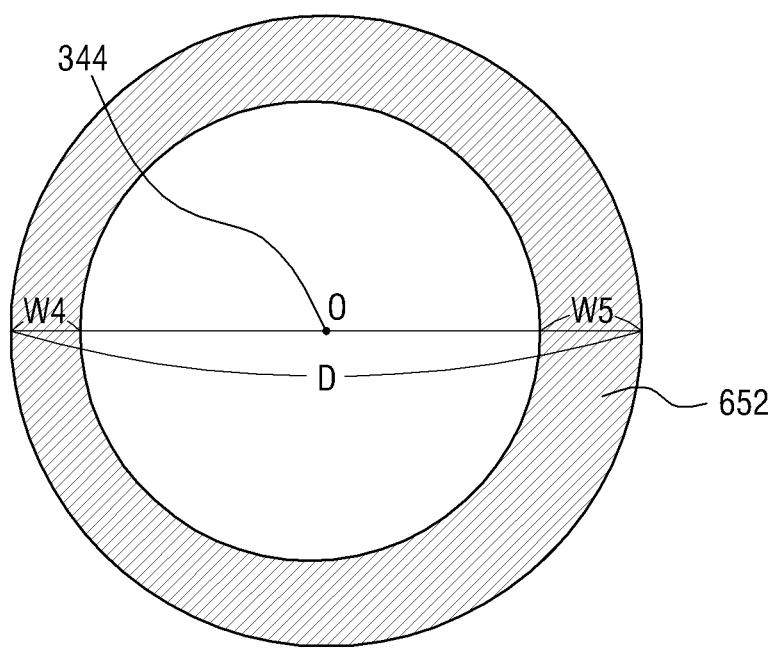
FIG. 12 is a plan view of the optical lens of FIG. 11.

FIG. 11 is a partial cross-sectional view of a region in which a light source module is arranged in a display device according to still another embodiment. FIG. 12 is a plan view of the optical lens of FIG. 11.

Referring to the embodiment of FIGS. 11 and 12, the reflection pattern 650 includes a first reflection pattern 351 and a second reflection pattern 652 and the second reflection pattern 652 has a non-uniform width varying from W4 to W5.

That is, the second reflection pattern 652 of the reflection pattern 650 has a ring shape with a non-uniform width varying from W4 to W5 measured in a direction from the circumference to the center point O of the upper surface portion 341 of the optical lens 340. The second reflection pattern 652 may be applied when the gap distances between the light sources 330 arranged on the printed circuit board 320 are different from each other. For example, if the first to third light sources are arranged in a line on the printed circuit board 320 and the gap distance between the first light source and the second light source is longer than the gap distance between the second light source and the third light source, the width W4 of the second reflection pattern 652 positioned on a portion of the second light source that is closer to the first light source may be less than the width W5 of the second reflection pattern 652 positioned on a portion of the second light source that is closer to the third light source. This is because the quantity of light overlapping in a region between the first and second light sources is less than the quantity of light overlapping in a region between the second and third light sources. Thus, the difference between the brightness of the light between the first and second light sources and the brightness of the light in the center portion of the second light source is greater than the difference between the brightness of the light between the second and third light sources and the brightness of light in the center region of the second light source. Accordingly, in order to reduce the difference between the brightness of the light between the first and second light sources and the brightness of the light in the center portion of the second light source, the light that travels to an upper side of the side portion 343 of the optical lens 330 in the portion of the second reflection pattern 652 of the second light source that is closer to the first light source should be greater than the light that travels to an upper side of the side portion 343 of the optical lens 330 in the portion of the second reflection pattern of the second light source that is close to the third light source.

In some embodiments, the widths W4 to W5 of the second reflection pattern 652 around the center point O of the optical lens 340 may also be about 20% to about 40% of the diameter D of the optical lens 340. In these embodiments, the orientation angle of the light may be increased to about 140° to about 180°. However, depending on the embodiment, the widths W4 and W5 of the second reflection pattern 652 may be less than about 20% or greater than about 40% of the diameter D of the optical lens 340.

Figure 13:
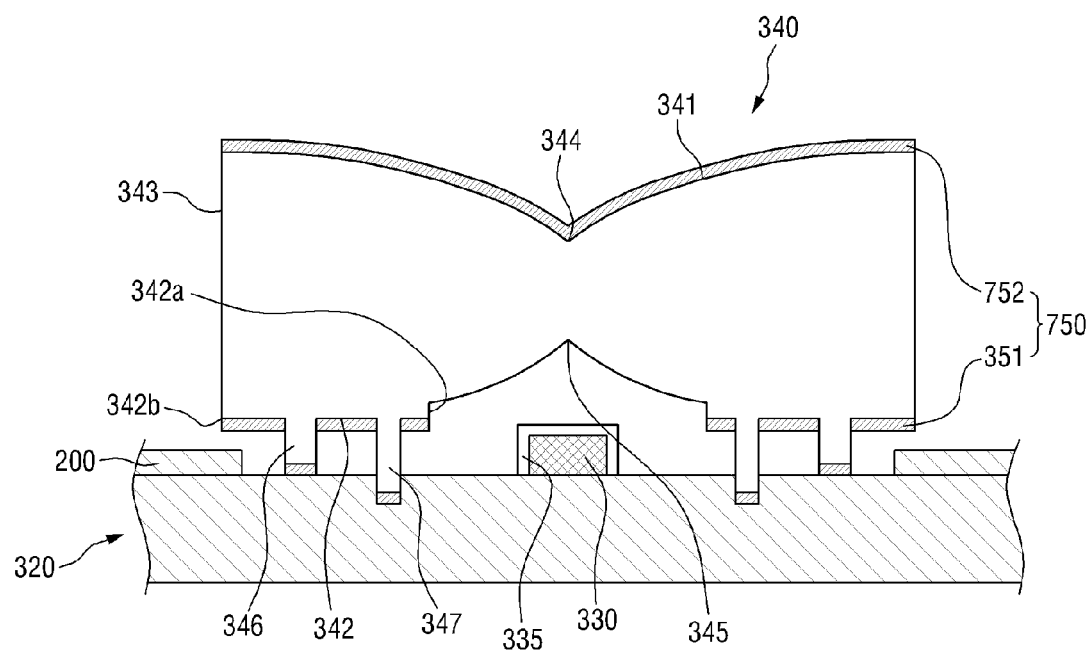
FIG. 13 is a partial cross-sectional view of a region in which a light source module is arranged in a display device according to still another embodiment.

FIG. 13 is a partial cross-sectional view of a region in which a light source module is arranged in a display device according to still another embodiment.

Referring to the embodiment of FIG. 13, the reflection pattern 750 includes a first reflection pattern 351 and a second reflection pattern 752 and the second reflection pattern 752 covers the whole upper surface portion 341 of the optical lens 340. The reflection pattern 750 may be applied to a display device having a thin profile which does not require high luminance due to a low loss of light measured between the light source module and the display panel. In contrast, in thick display devices which require high luminance due to a larger loss of light between the light source module and the display panel, the second reflection pattern 752 should be arranged to cover a part of the upper surface portion 341 of the optical lens rather than the whole surface thereof.

Figure 14:
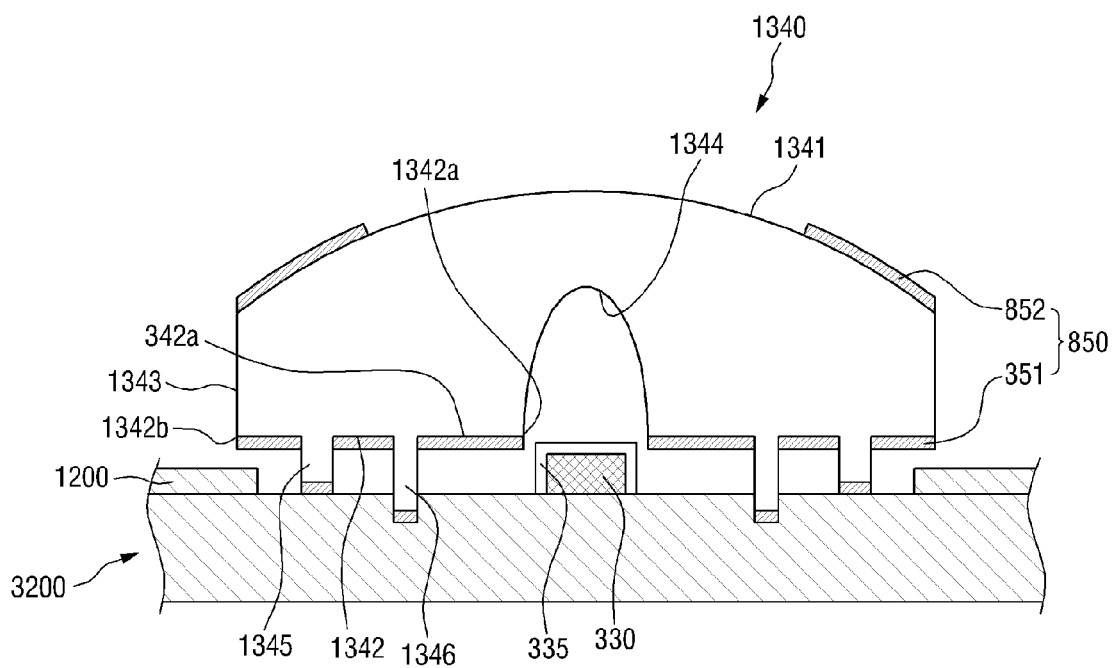
FIG. 14 is a partial cross-sectional view of a region in which a light source module is arranged in a display device according to still another embodiment.

FIG. 14 is a partial cross-sectional view of a region in which a light source module is arranged in a display device according to still another embodiment.

Referring to FIG. 14, the light source module has different optical lens 1340 and reflection patterns 850 in comparison to the light source module of FIG. 2.

The optical lens 1340 includes an upper surface portion 1341, a bottom surface portion 1342, and a side surface portion 1343. The optical lens 1340 may be made of polycarbonate or glass.

The upper surface portion 1341 of the optical lens 1340 may include a convex surface. The upper surface portion 1341 including the convex surface enables a large amount of the light that is emitted from the light source 330 to travel to an upper side of the optical lens 1340. Since the optical lens 1340 increases the luminance in the upper direction of the light source 330, it may be applied to a thick display device that requires high luminance due to the loss of light between the light source module and the display panel. In the center of a lower side of the optical lens 1340, a lower groove 1344 that is concavely recessed upward is formed. The lower groove 1344 increases the diffusion of light emitted from the light source 330 in the direction of the side portions 1343. Accordingly, hot spots which are typically generated when the light emitted to the center region of the upper portion of the optical lens is relatively greater than the light in other regions can be reduced.

The bottom surface portion 1342 of the optical lens 1340 may be similar to the bottom surface portion 342 of FIG. 3 and may be defined by an inner corner 1342a that is adjacent to the lower groove 1344 and an outer corner 1342b that is adjacent to the side surface portion 1343. In a plan view, the inner corner 1342a and the outer corner 1342b of the bottom surface portion 1342 form concentric circles.

A lens support leg 1345 and an alignment projection portion 1346 of the optical lens 1340 are similar to the lens support leg 346 and the alignment projection portion 347 of the optical lens 340 of FIG. 3, and thus, duplicate explanations thereof will be omitted.

A reflection pattern 850 is formed on the optical lens 1340 and includes a first reflection pattern 351 and second reflection pattern 852. In this embodiment, the second reflection pattern 852 is arranged on the optical lens 1340 having a convex upper surface portion 1341. The role of the optical lens 1340 is similar to the role of the optical lens 340 of FIG. 3. Further, although FIG. 14 illustrates that the reflection pattern 850 is the same as the reflection pattern 350 of FIG. 3, it may be formed to have substantially the same plan view as any of the optical patterns 450, 550, 650, and 750 of FIGS. 7 to 13.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

What is claimed is:

1. A light source module, comprising:
   a printed circuit board;
   a plurality of light sources arranged over the printed circuit board;
   a plurality of optical lenses respectively arranged over the light sources, wherein each of the optical lenses has upper and lower surfaces opposing each other; and
   a plurality of reflection patterns respectively formed on the optical lenses, wherein each of the reflection patterns includes a first reflection pattern formed on the lower surface of the corresponding optical lens and a second reflection pattern formed on the upper surface of the corresponding optical lens.

2. The light source module of claim 1, wherein each of the first and second reflection patterns comprises a lens abrasion prevention layer, a reflection layer formed on the lens abrasion prevention layer, and a protection layer formed on the reflection layer.

3. The light source module of claim 2, wherein each of the reflection layers is formed at least partially of aluminum or silver.

4. The light source module of claim 2, wherein each of the reflection layers comprises a plurality of layers having different refractive indexes.

5. The light source module of claim 4, wherein each of the plurality of layers is formed of a material selected from the group including magnesium fluoride, silicon dioxide, tantalum pentoxide, zinc sulfide, and titanium dioxide.

6. The light source module of claim 1, wherein each of the second reflection patterns has a ring shape having a predetermined width.

7. The light source module of claim 6, wherein each of the second reflection patterns is formed along the perimeter of the corresponding optical lens.

8. The light source module of claim 6, wherein each of the second reflection patterns is formed between the perimeter and the center of the corresponding optical lens.

9. The light source module of claim 1, wherein each of the second reflection patterns has a ring shape having a non-uniform width.

10. The light source module of claim 1, wherein each of the second reflection patterns has a substantially circular shape that is substantially concentric with the corresponding optical lens.

11. The light source module of claim 1, wherein each of the second reflection patterns has a width that is about 20% to about 40% of the diameter of the corresponding optical lens.

12. The light source module of claim 1, wherein each of the second reflection patterns covers the entire upper surface of the corresponding optical lens.

13. The light source module of claim 1, wherein each of the optical lenses further has an upper groove having a concavely recessed shape defined in the center of the upper surface thereof.

14. The light source module of claim 1, wherein each of the optical lenses further has an upwardly convex surface defined in the center of the upper surface thereof.

15. A backlight assembly, comprising:
   a receptacle;
   a printed circuit board arranged over the receptacle;
   a plurality of light sources arranged over the printed circuit board;
   a plurality of optical lens respectively arranged over the light sources, wherein each of the optical lenses has upper and lower surfaces opposing each other;
   a plurality of reflection patterns respectively formed on the optical lenses, wherein each of the reflection patterns includes a first reflection pattern formed on the lower surface of the corresponding optical lens and a second reflection pattern formed on the upper surface of the corresponding optical lens; and
   a reflection sheet arranged over the receptacle and including a plurality of openings in which the optical lens are placed.

16. The backlight assembly of claim 15, wherein each of the first and second reflection patterns comprises a lens abrasion prevention layer, a reflection layer formed on the lens abrasion prevention layer, and a protection layer formed on the reflection layer.

17. The backlight assembly of claim 15, wherein the width of each of the second reflection patterns is about 20% to about 40% of the diameter of the corresponding optical lens.

18. The backlight assembly of claim 15, wherein each of the second reflection patterns covers the entire upper surface of the corresponding optical lens.

19. A display device, comprising:

a receptacle;

a printed circuit board arranged over the receptacle;

a plurality of light sources arranged over the printed circuit board;

a plurality of optical lens respectively arranged over the light sources, wherein each of the optical lenses has upper and lower surfaces opposing each other;

a plurality of reflection patterns respectively formed on the optical lenses, wherein each of the reflection patterns includes a first reflection pattern formed on the lower surface of the corresponding optical lens and a second reflection pattern formed on the upper surface of the corresponding optical lens;

a reflection sheet arranged over the receptacle and including a plurality of openings in which the optical lens are placed;

an optical sheet arranged over the reflection sheet; and a display panel arranged over the optical sheet.

20. The display device of claim 19, wherein each of the second reflection patterns at least partially overlaps the corresponding first reflection pattern.

* * * * *